(12) United States Patent
Zhang et al.

(10) Patent No.: US 11,050,442 B2
(45) Date of Patent: Jun. 29, 2021

(54) REDUCING THE LATENCY OF A SYNDROME-BASED QUASI-CYCLIC DECODER

(71) Applicant: SK hynix Inc., Icheon-Si (KR)

(72) Inventors: Fan Zhang, San Jose, CA (US); Meysam Asadi, San Jose, CA (US); Jianqing Chen, San Jose, CA (US); Xuanxuan Lu, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/573,065

(22) Filed: Sep. 17, 2019

(65) Prior Publication Data

US 2021/0083694 A1    Mar. 18, 2021

(51) Int. Cl.
| | |
|---|---|
| *G11C 29/00* | (2006.01) |
| *H03M 13/00* | (2006.01) |
| *G06F 11/10* | (2006.01) |
| *H03M 13/09* | (2006.01) |
| *G06F 12/10* | (2016.01) |
| *H03M 13/15* | (2006.01) |

(52) U.S. Cl.
CPC ..... *H03M 13/6502* (2013.01); *G06F 11/1068* (2013.01); *G06F 12/10* (2013.01); *H03M 13/096* (2013.01); *H03M 13/1575* (2013.01)

(58) Field of Classification Search
CPC .......... H03M 13/6502; H03M 13/096; H03M 13/1575; G06F 11/1068; G06F 12/10
See application file for complete search history.

(56) References Cited

U.S. PATENT DOCUMENTS

| | | | |
|---|---|---|---|
| 8,291,283 B1 | 10/2012 | Rad et al. | |
| 2013/0080862 A1* | 3/2013 | Bennett | G06F 11/1072 714/782 |
| 2016/0020783 A1 | 1/2016 | Yang et al. | |
| 2019/0044537 A1* | 2/2019 | Reynwar | H03M 13/3723 |

* cited by examiner

*Primary Examiner* — Samir W Rizk
(74) *Attorney, Agent, or Firm* — Perkins Coie LLP (57) ABSTRACT

Disclosed are devices, systems and methods for reducing the latency of a quasi-cyclic linear code decoder. An example method includes receiving a noisy codeword, the codeword having been generated from a quasi-cyclic linear code and provided to a communication channel prior to reception by the decoder; computing a syndrome based on the noisy codeword; generating a plurality of memory cell addresses, a first memory cell address being a function of the syndrome and subsequent memory cell addresses being within a predetermined address range of the function of the syndrome; reading, in a parallel manner to reduce the latency of the decoder, a plurality of error patterns from the plurality of memory cell addresses and computing a checksum for each of the plurality of error patterns; and determining, based on the checksum for each of the plurality of error patterns, a candidate version of the transmitted codeword.

20 Claims, 10 Drawing Sheets

REDUCING THE LATENCY OF A SYNDROME-BASED QUASI-CYCLIC DECODER

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, the multi-level NAND flash devices can be inherently unreliable and generally need to use ECCs to allow dramatic increase in data reliability at the expense of extra storage space for ECC parity bits. There is a demand for increasingly efficient ECCs that can provide data protection with minimal latency.

SUMMARY

Embodiments of the disclosed technology relate to methods, devices and systems for reducing the latency of a syndrome-based quasi-cyclic decoder. The methods and devices described in the present document advantageously, among other features and benefits, enable low-latency implementations of quasi-cyclic linear code decoders.

In an example aspect, a method for reducing latency of a decoder includes receiving a noisy codeword, the codeword having been generated from a quasi-cyclic linear code and provided to a communication channel prior to reception by the decoder; computing a syndrome based on the noisy codeword; generating a plurality of memory cell addresses, a first memory cell address being a function of the syndrome and subsequent memory cell addresses being within a predetermined address range of the function of the syndrome; reading, in a parallel manner to reduce the latency of the decoder, a plurality of error patterns from the plurality of memory cell addresses and computing a checksum for each of the plurality of error patterns; and determining, based on the checksum for each of the plurality of error patterns, a candidate version of the transmitted codeword.

In another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Flash memory is ubiquitous in portable electronic devices, such as computers, digital cameras, digital music players, cellular telephones, personal data assistants (PDAs), or the like. These host devices communicate with the flash memory using a flash translation layer (FTL), which is a table is used to divert the address of any host request (called a logical block address (LBA)) to the real location that the corresponding data was stored in the flash memory (called a physical block address (PBA)). The size of this table is typically quite large, and is usually stored in dynamic random access memory (DRAM).

Typically, the FTL performs at least the following functions:

Write updated information to a new empty page and divert all the subsequent requests to its new address Maintain wear-leveling by uniformly using the available pages Efficiently perform a garbage collection operation for all the used blocks FIGS. 1-6 overview a non-volatile memory system in which embodiments of the disclosed technology may be implemented.

Figure 1:
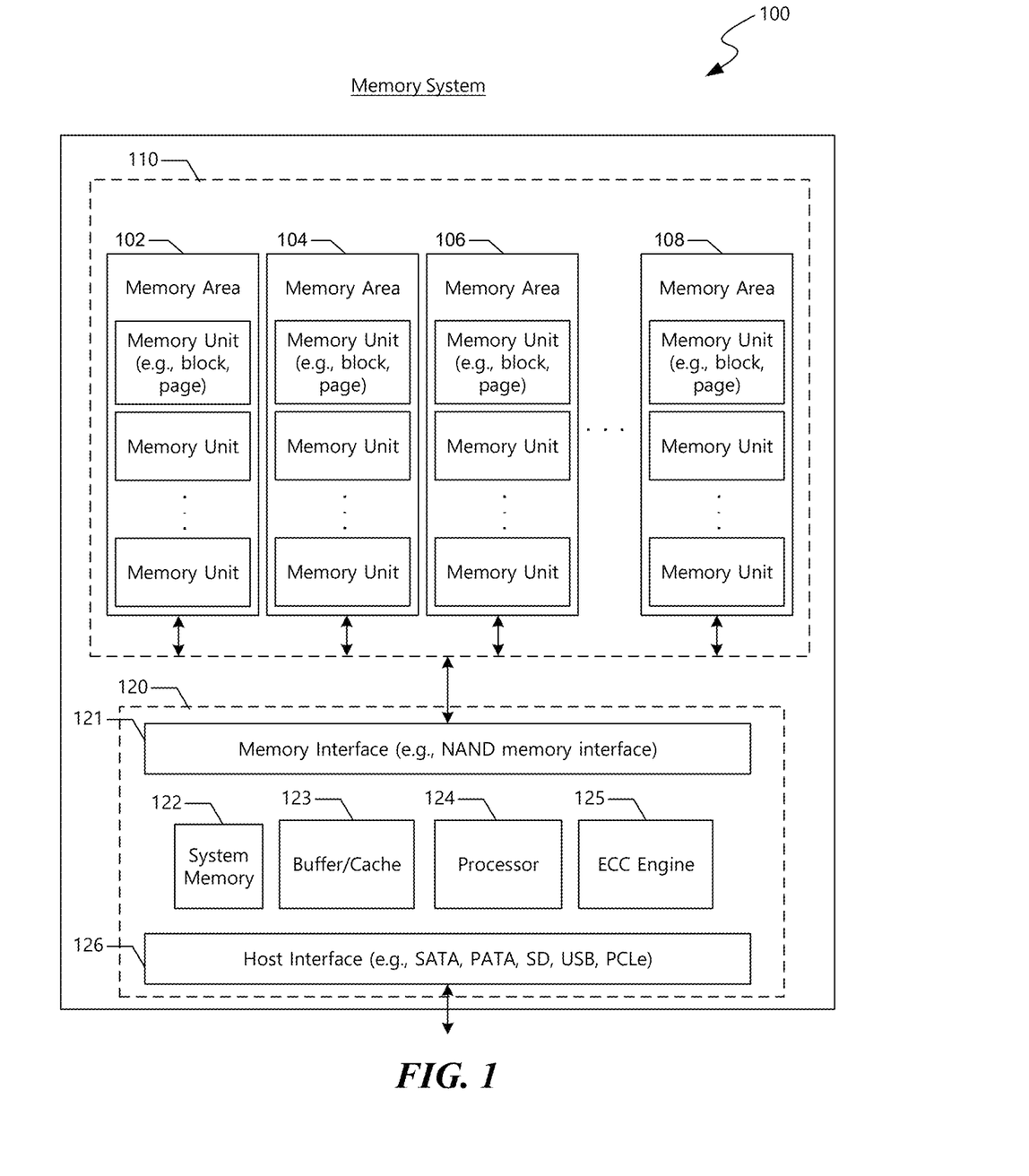
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
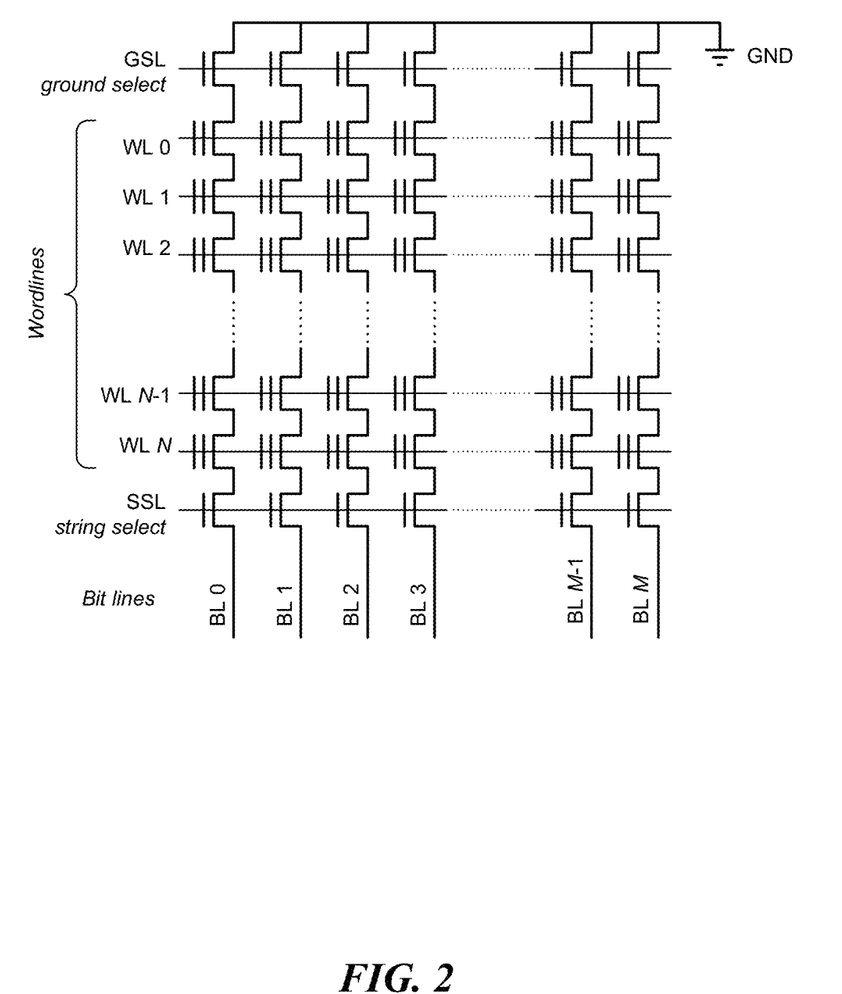
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
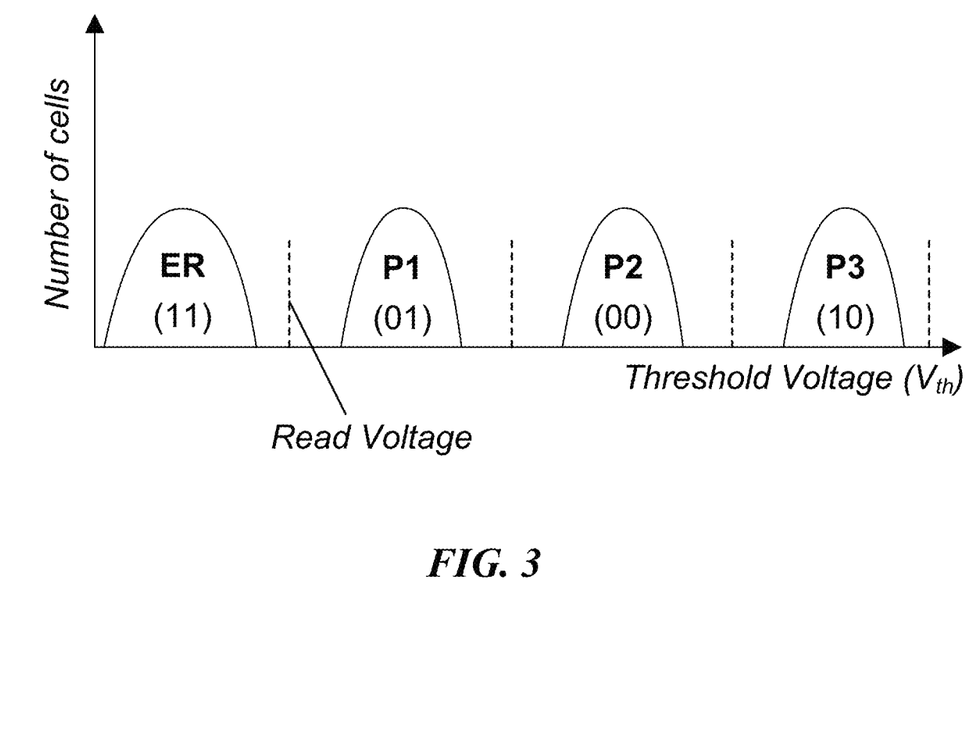
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
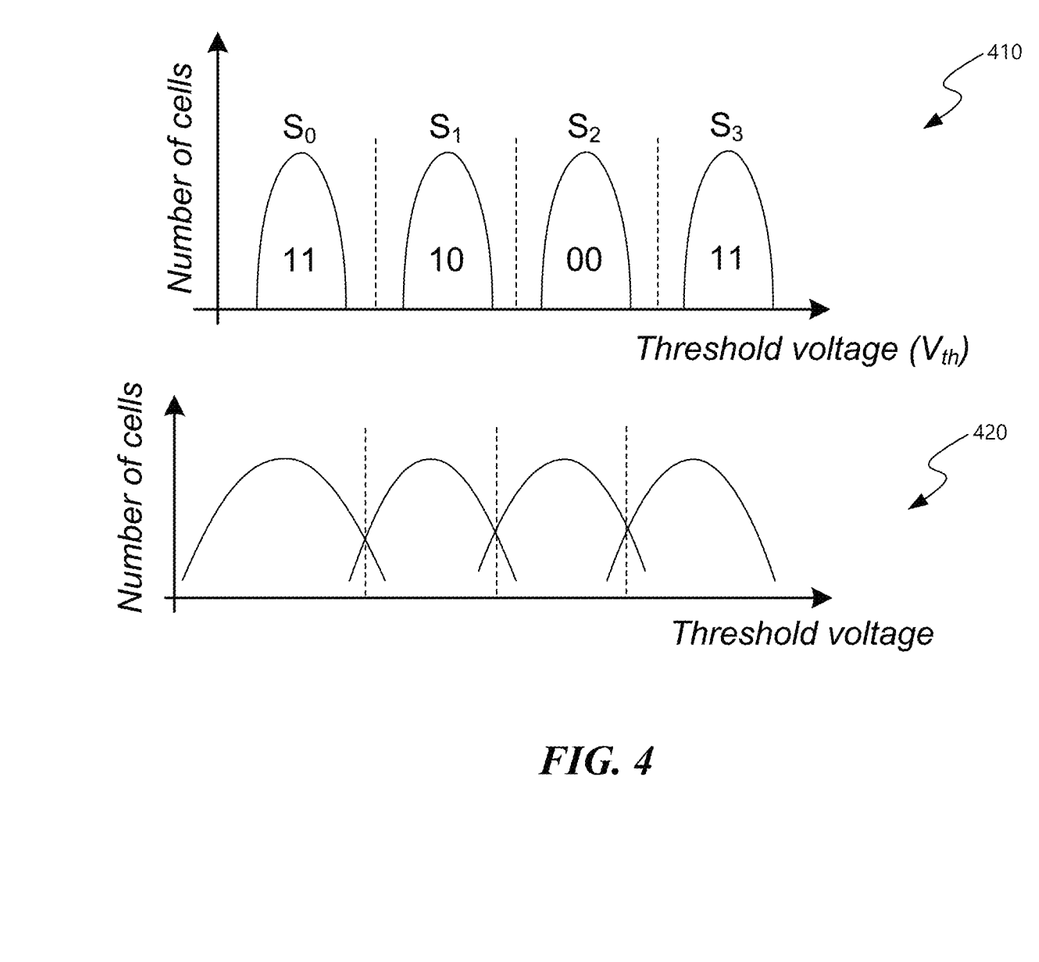
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
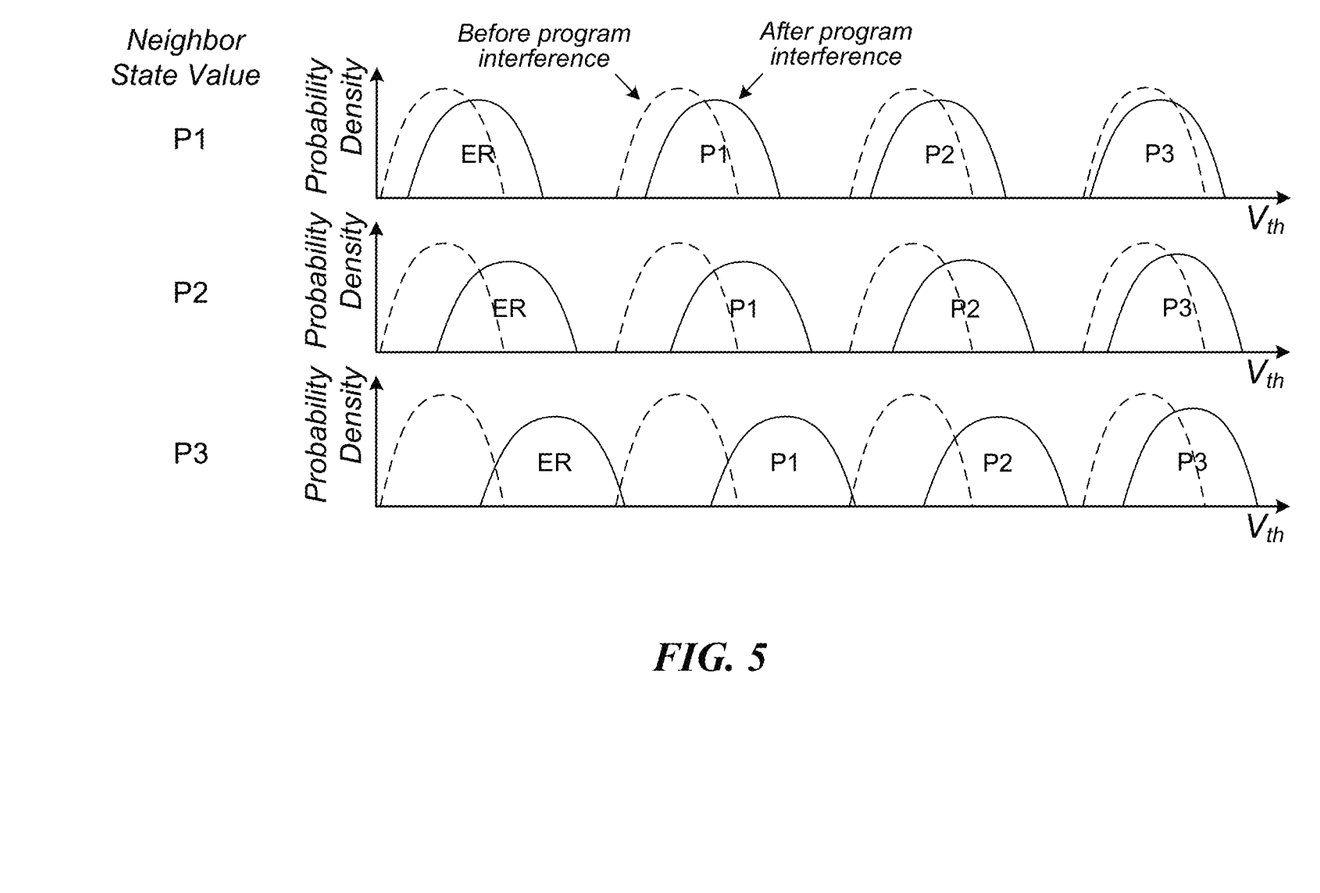
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
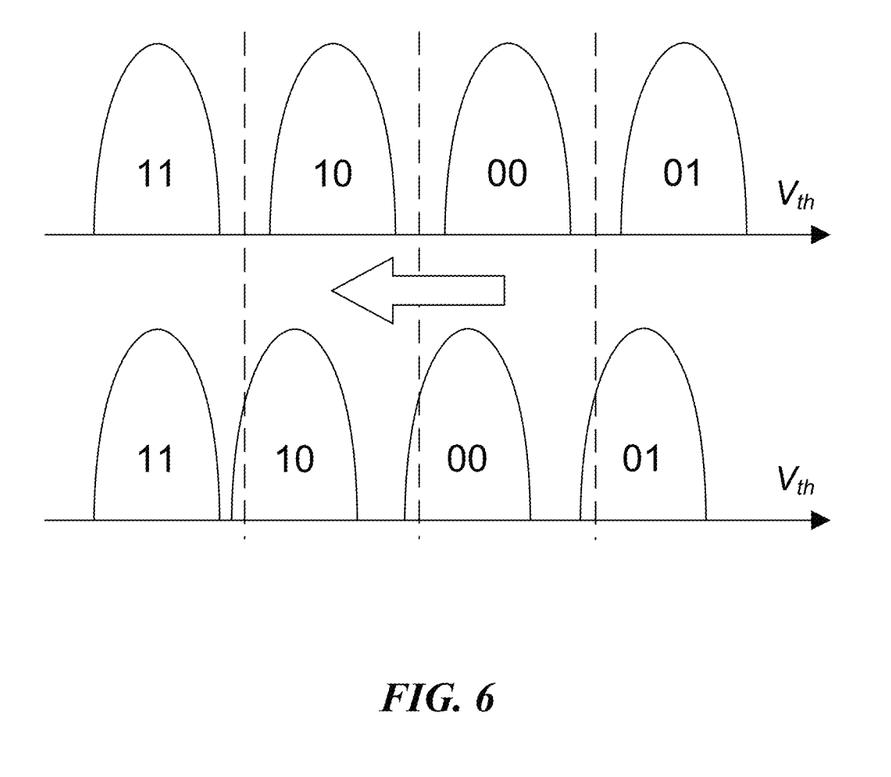
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

The distortion and interference effects described in FIGS. 4-6 can occur in the DRAM that stores the FTL, and in most cases, a majority of the ECC workload is for correcting any error when the data (e.g., FTL mappings from LBA to PBA) is read from DRAM.

Embodiments of the disclosed technology include methods, systems and devices that reduce the decoding latency of an ECC that is known to be optimal (based on its error correction capability and high minimum distance) for encoding/decoding the FTL table. In an example, the decoding latency is reduced by reordering the parity check matrix of the ECC in a particular manner and implementing parallel processing for certain portions of the ECC computations.

Existing ECC implementations use a single-error correcting and double-error detecting, abbreviated as SECDED, code with provides a minimum distance ($d_{min}$) of 4. This means that the decoder can correct 1 error in the correction mode and can detect up to 3 errors in the detection mode.

Figure 7:
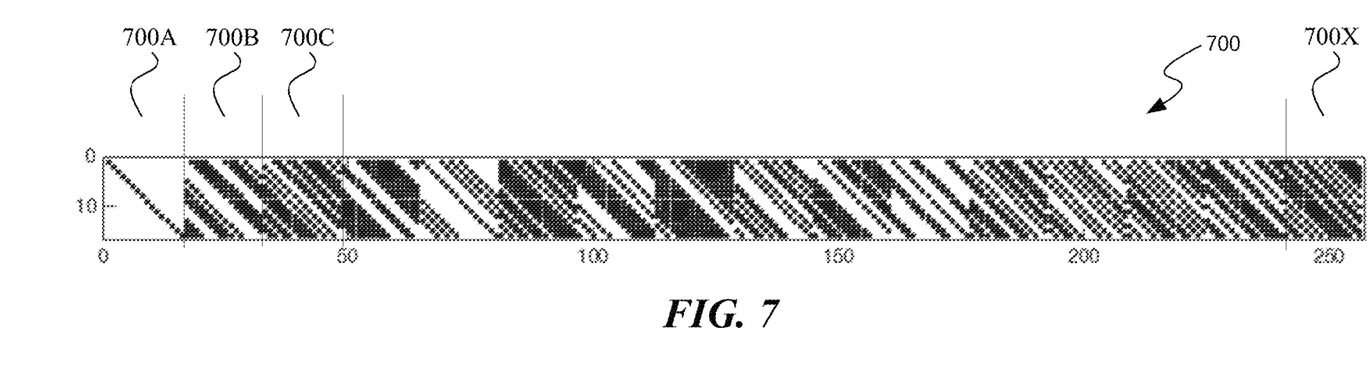
FIG. 7 illustrates an example parity check matrix of a quasi-cyclic code.

In some embodiments, a (256, 240) quasi-cyclic linear code with $d_{min}$=5 is used. This quasi-cyclic linear code generates 256−240=16 parity bits for 240 input data bits, and can correct up to two errors (as compared to the originally 1 error), which significantly improves the codeword failure rate (CFR). An example of a parity check matrix 700 of the (256, 240) quasi-cyclic linear code is illustrated in FIG. 7. As illustrated therein, the 256×16 parity check matrix 700 includes sub-matrices of size 16×16 (denoted 700A, 700B, 700C, . . . 700X), each of which is a circulant sub-matrix (and wherein a dot in a sub-matrix denotes a non-zero value).

The example embodiment includes a syndrome-based decoder for quasi-cyclic linear codes, for which only two error patterns are considered; specifically, 256 single bit errors and ($_2^{256}$) two-bit errors (since this ECC can correct up to two errors). In an example of an existing system, a syndrome may include 16-bit vectors, and the total memory used by a conventional (256, 240) quasi-cyclic linear code would be 64.25 kilobytes (KB). In contrast, an exemplary quasi-cyclic syndrome-based decoder described in the present document, which leverages the quasi-cyclic property of the parity check matrix and implements hash-based addressing to compress the standard array decoding table, uses a total memory of 5 KB.

Figure 8:
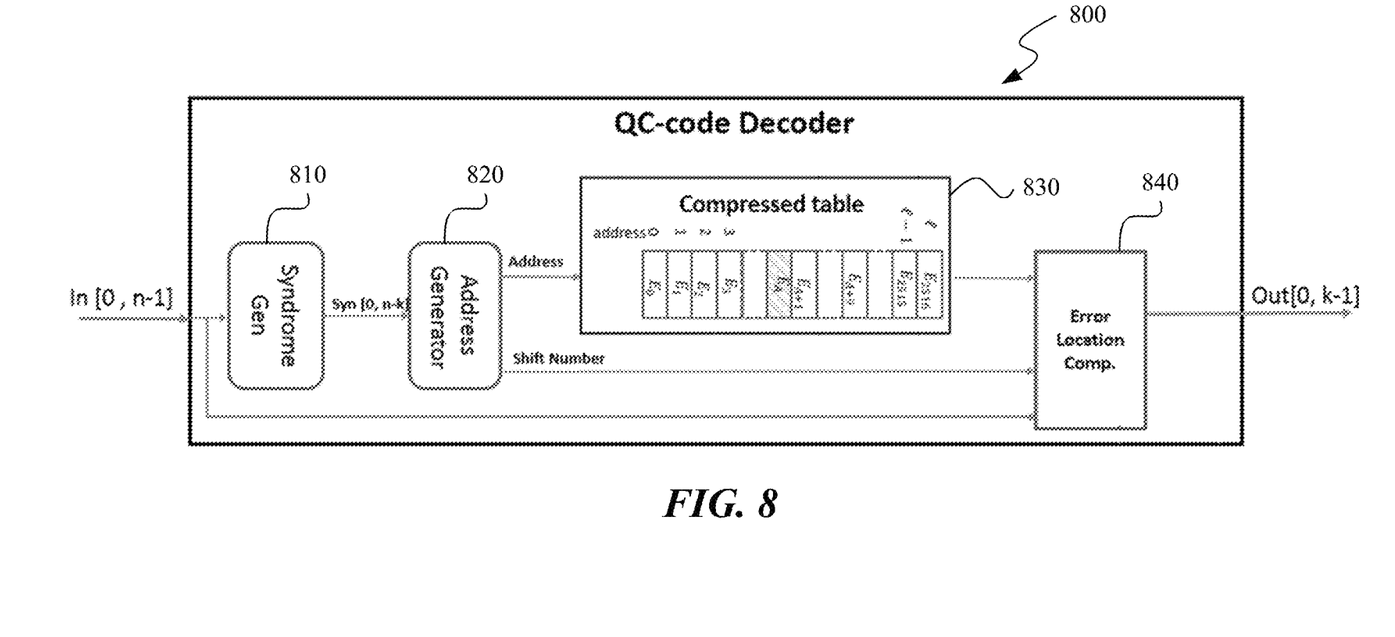
FIG. 8 is a block diagram illustrating an example of a quasi-cyclic syndrome-based decoder.

A block diagram of a quasi-cyclic syndrome-based decoder 800 in accordance with an example embodiment is illustrated in FIG. 8. As illustrated therein, an n-bit received noisy codeword (denoted In[0,n−1] in FIG. 8) is used to compute a syndrome (S) by the syndrome generator 810. For example, if the parity check matrix is denoted as H, then the syndrome is computed as $$S = H \cdot (\text{In}[0, n-1])^T.$$

The (n−k+1)-bit syndrome (denoted Syn[0,n−k] in FIG. 8) is input to an address generator 820, which generates an address and a shift number. In some embodiments, the output address is generated based on a hash function, and the shift number calculated is the maximum possible shift. In other embodiments, the hash function performs a modulo operation (with the memory size as the modulus) to generate the address. In an example, the hash function may be the MD-5 or SHA-3 hash function. In another example, the hash function may be implemented using a linear-feedback shift register (LF SR).

In some embodiments, the quasi-cyclic syndrome-based decoder 800 includes a compressed table 830 that consists of error patterns. In some embodiments, the error patterns include coset leaders that correspond to unique syndrome-error pairs. In an example, the unique syndrome-error pairs are identified based on the cyclic shift property of the parity check matrix of the quasi-cyclic linear code.

The output address (A) is used as an index in the compressed table 830 to read a single coset leader. Furthermore, the compressed table 830 is designed so that a unique function of corresponding syndrome will be in a range (denoted δ) of address A inside the compressed table 830. In some embodiments, all the error patterns in the range A to A+δ of the compressed table are checked in a parallel manner, to advantageously reduce the latency of the decoder, and find the correct error pattern coset leader. Implementing error pattern checking in a parallel manner enables the implementation of the quasi-cyclic code described herein in the flash translation layer (FTL). The FTL has stringent latency requirements since it is continually responsible for bad block re-mapping (via LBAs and PBAs) and wear leveling as the storage medium is being access for read/write operations.

The correct error pattern coset leader, the shift number (generated by the address generator 820) and the received noisy codeword (In[0,n−1]) are input to the error location computer 840 that computes the correct error pattern. In an example, the correct error pattern is determined based on the correct error pattern coset leader and the shift number. The correct error pattern and the received noisy codeword are used to output the candidate (or most likely) transmitted codeword (denoted Out[0,k−1] in FIG. 8).

Figure 9A:
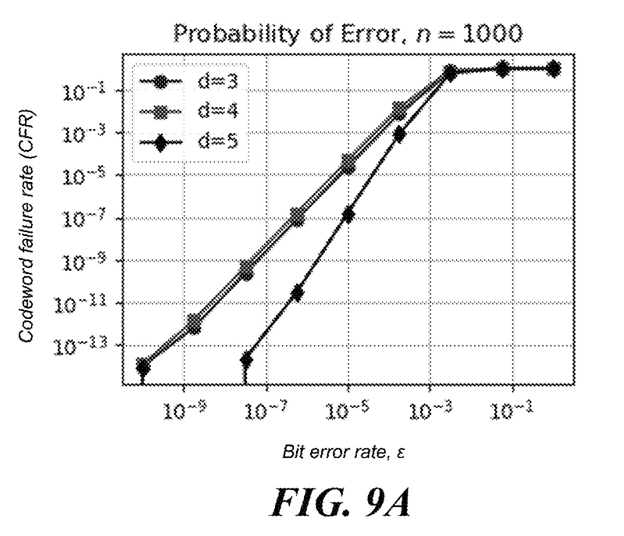
FIG. 9A is an example performance plot comparing the codeword failure rate (CFR) for different minimum distances, as a function of the bit error rate.
Figure 9B:
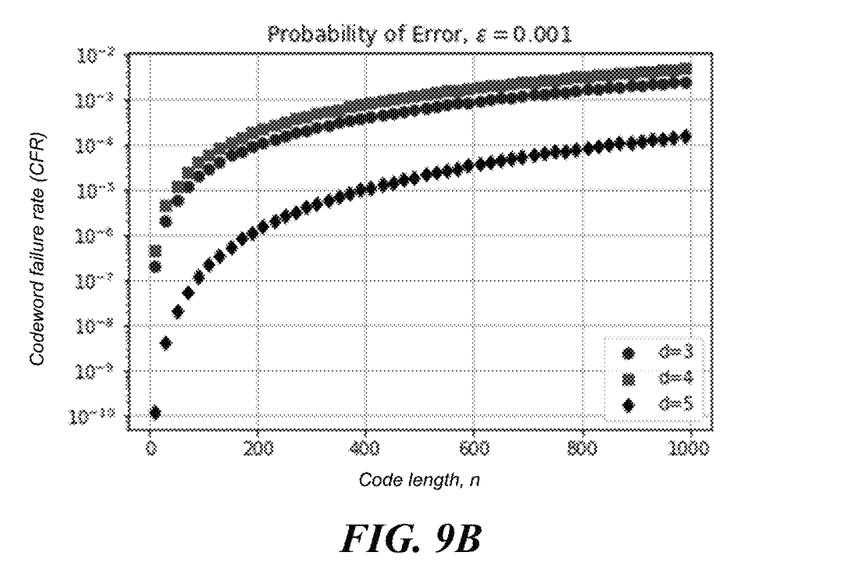
FIG. 9B is an example performance plot comparing the codeword failure rate (CFR) for different minimum distances, as a function of the code length.

FIGS. 9A and 9B are performance plots that illustrate the codeword failure rate (CFR) of an example quasi-cyclic linear code described in the present document, with length n and a minimum distance d over a channel with a failure bit rate (or bit error rate) of E. FIG. 9A plots the CFR as a function of the bit error rate c (for a fixed value of n=1000) and FIG. 9B plots the CFR as a function of the code length n (for a fixed bit error rate of c=0.001). As illustrated therein, the probability of decoding error for d=5 is reduced by more than an order of magnitude in comparison to d=3 or 4.

Figure 10:
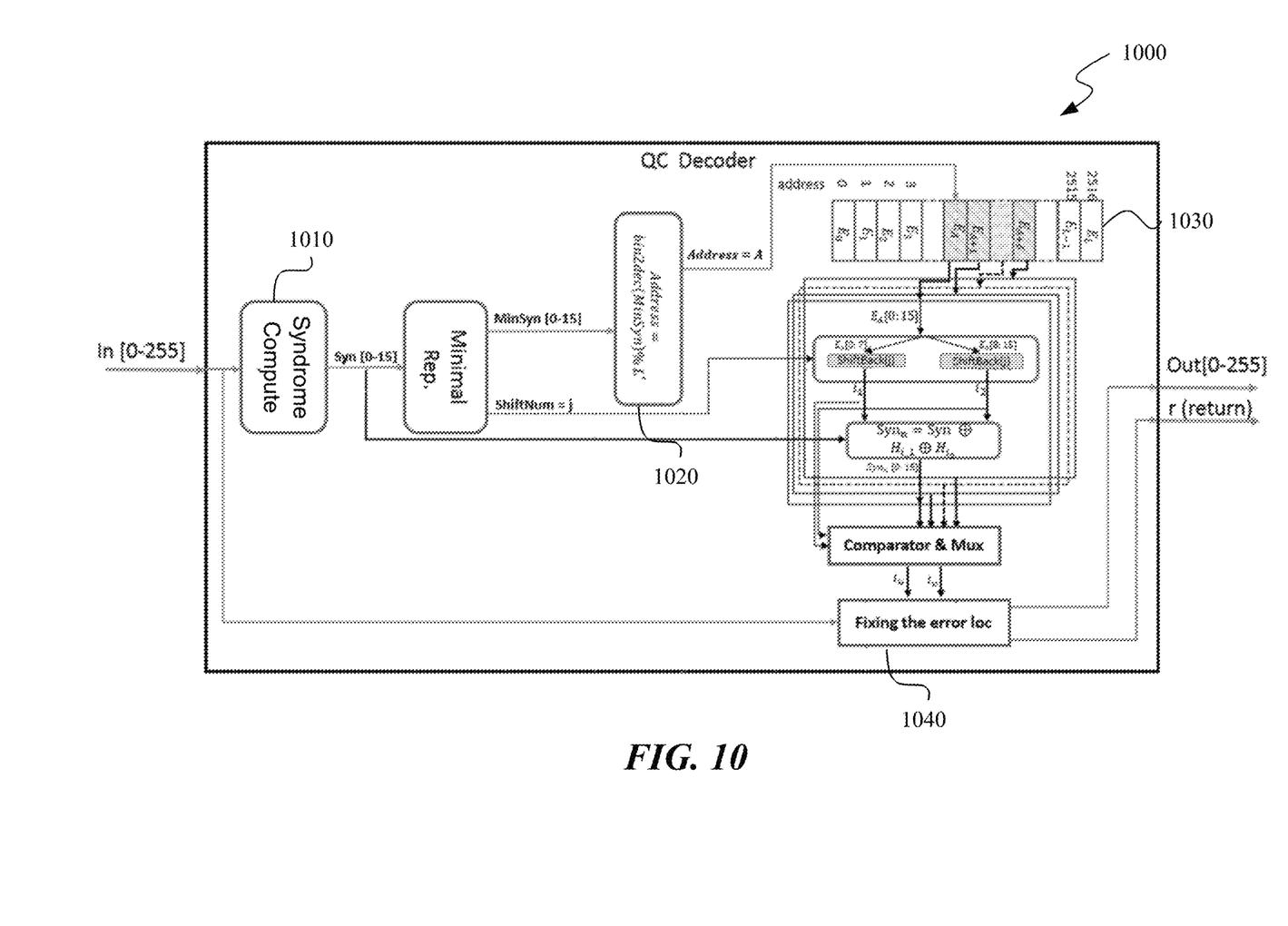
FIG. 10 is a block diagram illustrating another example of a quasi-cyclic syndrome-based decoder with low-latency operations.

A block diagram of another example of the quasi-cyclic syndrome-based decoder 1000 is illustrated in FIG. 10. This example includes some features and/or components that are similar to those shown in FIG. 8, and described above. At least some of these features and/or components may not be separately described in the context of FIG. 10.

As illustrated in FIG. 10, the address (A) is computed as a function of the syndrome, which is then used to identify error patterns. The compressed standard array table 1030 does not contain all possible error patterns, but rather, the address A is used to identify a range of possible (or candidate) error patterns which correspond to the computed syndrome. In an example, the error patterns within an address range A to A+δ are identified in the compressed standard array table 1030 and then checked in a parallel manner, which advantageously reduces the latency of the decoder. In some embodiments, any bit vector (e.g., syndromes, error pattern, etc.) stored in memory can be stored using its decimal representation.

Furthermore, the decoder latency is further reduced by leveraging the structure of the quasi-cyclic parity check matrix, which for the (256, 240) quasi-cyclic linear code, includes multiple 16×16 sub-matrices. In an example, the columns of each circulant sub-matrix are sorted based on their corresponding decimal representation. The reordering of the columns of the quasi-cyclic parity check matrix advantageously enables the correct error location to be computed (for each stored error pattern) using less computation compared to the original (unsorted) version. The use of the reordered quasi-cyclic parity check matrix enables the post-processing operation to be simplified to just a shift operation which can be performed efficiently in hardware.

Figure 11:
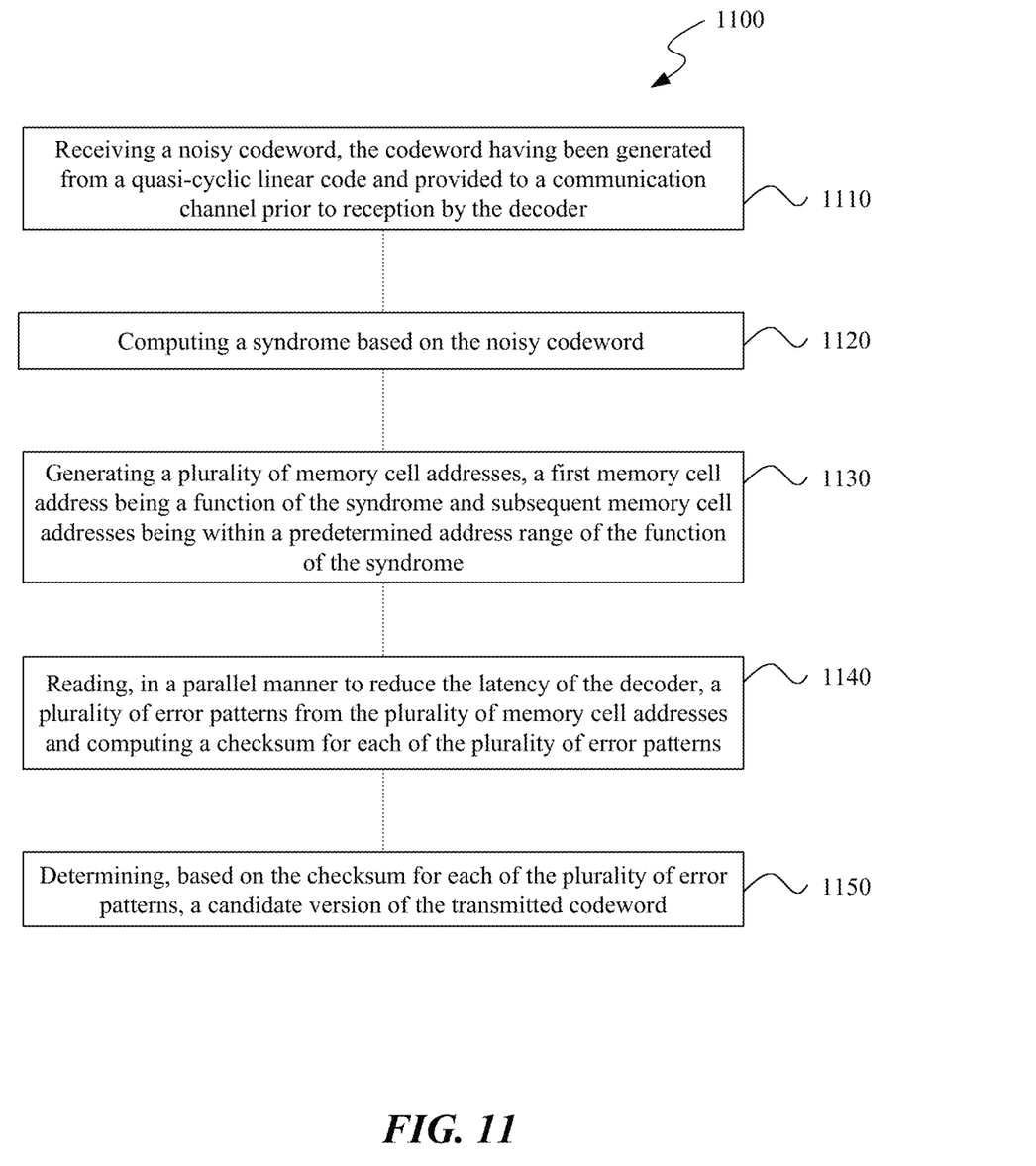
FIG. 11 illustrates a flowchart of another example method for reducing the latency of a quasi-cyclic linear code decoder.

FIG. 11 illustrates a flowchart of a method 1100 for reducing the latency of a quasi-cyclic linear code decoder. The method 1100 includes, at operation 1110, receiving a noisy codeword, the codeword having been generated from a quasi-cyclic linear code and provided to a communication channel prior to reception by the decoder.

The method 1100 includes, at operation 1120, computing a syndrome based on the noisy codeword. In an example, computing the syndrome is based on a product of the noisy codeword and the parity check matrix of the quasi-cyclic decoder.

The method 1100 includes, at operation 1130, generating a plurality of memory cell addresses, a first memory cell address being a function of the syndrome and subsequent memory cell addresses being within a predetermined address range of the function of the syndrome.

In some embodiments, the predetermined address range comprises consecutive memory cell addresses.

The method 1100 includes, at operation 1140, reading, in a parallel manner to reduce the latency of the decoder, a plurality of error patterns from the plurality of memory cell addresses and computing a checksum for each of the plurality of error patterns.

The method 1100 includes, at operation 1150, determining, based on the checksum for each of the plurality of error patterns, a candidate version of the transmitted codeword.

In some embodiments, one or more error locations in the plurality of error patterns are computed based on a decimal representation of at least one column of a parity check matrix of the quasi-cyclic linear code.

In some embodiments, the quasi-cyclic linear code is a quasi-cyclic (256, 240) linear code that is used in a flash translation layer (FTL), and the codeword includes a mapping from a logical block address (LBA) to a physical block address (PBA).

In some embodiments, a parity check matrix of the quasi-cyclic linear code comprises a plurality of N×N circulant sub-matrices. In an example, N=16.

In some embodiments, the function of the syndrome is a hash function of the syndrome, and the hash function is based on an open addressing hash table.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for reducing a latency of a decoder, comprising:
   receiving a noisy codeword, the codeword having been generated from a quasi-cyclic linear code and provided to a communication channel prior to reception by the decoder;
   computing a syndrome based on the noisy codeword;
   generating a plurality of memory cell addresses, wherein a first memory cell address is computed as a mathematical function of the syndrome and subsequent memory cell addresses are within a predetermined address range of the first memory cell address, and wherein the first memory cell address corresponds to a coset leader of a plurality of error patterns associated with the syndrome;
   reading, in a parallel manner to reduce the latency of the decoder, the plurality of error patterns, from a compressed standard array table using the plurality of memory cell addresses, and computing a checksum for each of the plurality of error patterns; and
   determining, based on the checksum for each of the plurality of error patterns, a candidate version of the transmitted codeword.

2. The method of claim 1, wherein the predetermined address range comprises consecutive memory cell addresses.

3. The method of claim 1, wherein one or more error locations in the plurality of error patterns are computed based on a decimal representation of at least one column of a parity check matrix of the quasi-cyclic linear code.

4. The method of claim 1, wherein the quasi-cyclic linear code is a quasi-cyclic (256, 240) linear code that is used in a flash translation layer (FTL).

5. The method of claim 4, wherein the codeword is a mapping from a logical block address (LBA) to a physical block address (PBA).

6. The method of claim 1, wherein a parity check matrix of the quasi-cyclic linear code comprises a plurality of N×N circulant sub-matrices.

7. The method of claim 6, wherein N=16.

8. The method of claim 1, wherein the mathematical function of the syndrome is a hash function of the syndrome, and wherein the hash function is based on an open addressing hash table.

9. An apparatus for reducing a latency of a decoder, the apparatus comprising:
   at least one processor; and
   a non-transitory memory with instructions stored thereon, the instructions upon execution by the at least one processor, causing the at least one processor to:
      receive a noisy codeword, the codeword having been generated from a quasi-cyclic linear code and provided to a communication channel prior to reception by the decoder;
      compute a syndrome based on the noisy codeword;
      generate a plurality of memory cell addresses, wherein a first memory cell address is computed as a mathematical function of the syndrome and subsequent memory cell addresses are within a predetermined address range of the first memory cell address, and wherein the first memory cell address corresponds to a coset leader of a plurality of error patterns associated with the syndrome;
      read, in a parallel manner to reduce the latency of the decoder, a plurality of error patterns, from a compressed standard array table using the plurality of memory cell addresses, and computing a checksum for each of the plurality of error patterns; and determine, based on the checksum for each of the plurality of error patterns, a candidate version of the transmitted codeword.

10. The apparatus of claim 9, wherein the predetermined address range comprises consecutive memory cell addresses.

11. The apparatus of claim 9, wherein one or more error locations in the plurality of error patterns are computed based on a decimal representation of at least one column of a parity check matrix of the quasi-cyclic linear code.

12. The apparatus of claim 9, wherein the quasi-cyclic linear code is a quasi-cyclic (256, 240) linear code that is used in a flash translation layer (FTL), and wherein the codeword is a mapping from a logical block address (LBA) to a physical block address (PBA).

13. The apparatus of claim 9, wherein a parity check matrix of the quasi-cyclic linear code comprises a plurality of N×N circulant sub-matrices, and wherein N=16.

14. The apparatus of claim 9, wherein the mathematical function of the syndrome is a hash function of the syndrome, and wherein the hash function is based on an open addressing hash table.

15. A non-transitory computer readable storage medium having instructions stored thereupon, the instructions, when executed by a processor, causing the processor to implement a method for reducing a latency of a decoder, comprising:

instructions for receiving a noisy codeword, the codeword having been generated from a quasi-cyclic linear code and provided to a communication channel prior to reception by the decoder;

instructions for computing a syndrome based on the noisy codeword;

instructions for generating a plurality of memory cell addresses, wherein a first memory cell address is computed as a mathematical function of the syndrome and subsequent memory cell addresses are within a predetermined address range of the first memory cell address, and wherein the first memory cell address corresponds to a coset leader of a plurality of error patterns associated with the syndrome;

instructions for reading, in a parallel manner to reduce the latency of the decoder, the plurality of error patterns, from a compressed standard array table using the plurality of memory cell addresses, and computing a checksum for each of the plurality of error patterns; and instructions for determining, based on the checksum for each of the plurality of error patterns, a candidate version of the transmitted codeword.

16. The non-transitory computer readable storage medium of claim 15, wherein the predetermined address range comprises consecutive memory cell addresses.

17. The non-transitory computer readable storage medium of claim 15, wherein one or more error locations in the plurality of error patterns are computed based on a decimal representation of at least one column of a parity check matrix of the quasi-cyclic linear code.

18. The non-transitory computer readable storage medium of claim 15, wherein the quasi-cyclic linear code is a quasi-cyclic (256, 240) linear code that is used in a flash translation layer (FTL), and wherein the codeword is a mapping from a logical block address (LBA) to a physical block address (PBA).

19. The non-transitory computer readable storage medium of claim 15, wherein a parity check matrix of the quasi-cyclic linear code comprises a plurality of N×N circulant sub-matrices, and wherein N=16.

20. The non-transitory computer readable storage medium of claim 15, wherein the mathematical function of the syndrome is a hash function of the syndrome, and wherein the hash function is based on an open addressing hash table.

* * * * *